United States Patent [19]
Miwa

[11] Patent Number: 5,187,554
[45] Date of Patent: Feb. 16, 1993

[54] BIPOLAR TRANSISTOR
[75] Inventor: Hiroyuki Miwa, Kanagawa, Japan
[73] Assignee: Sony Corporation, Tokyo, Japan
[21] Appl. No.: 696,301
[22] Filed: Apr. 29, 1991

Related U.S. Application Data
[63] Continuation of Ser. No. 231,672, Aug. 8, 1988, abandoned.

[30] Foreign Application Priority Data
Aug. 11, 1987 [JP] Japan .................................. 62-199006

[51] Int. Cl.$^5$ ..................... H01L 29/72; H01L 29/06; H01L 23/48
[52] U.S. Cl. ................................... 307/586; 257/587; 257/621; 257/624; 257/774
[58] Field of Search ........................ 357/34, 43, 55, 56, 357/65

[56] References Cited
U.S. PATENT DOCUMENTS
| | | |
|---|---|---|
| 3,534,234 | 10/1970 | Clevenger . |
| 4,252,581 | 2/1981 | Anantha et al. . |
| 4,642,883 | 2/1987 | Sakurai et al. .................... 357/34 |
| 4,705,599 | 11/1987 | Suda et al. ...................... 357/34 |
| 4,733,287 | 3/1988 | Bower ........................... 357/34 |

FOREIGN PATENT DOCUMENTS
| | | |
|---|---|---|
| 177246 | 4/1986 | European Pat. Off. . |
| 2168845 | 6/1986 | United Kingdom .................. 357/34 |

OTHER PUBLICATIONS
IBM Technical Disclosure Bulletin, vol. 24, No. 9, Feb. 1982, "Bltra Dense, High Performance Bipolar Transistor"; pp. 4662-4664.

Primary Examiner—J. Carroll
Attorney, Agent, or Firm—Hill, Steadman & Simpson

[57] ABSTRACT
A bipolar transistor in which a buried collector region, a base region and an emitter region are formed in a device forming region surrounded by an isolation region and in which a base contact electrode and a collector contact electrode are arranged in symmetry with each other, and a process for preparing the transistor. The collector contact electrode is formed through an opening formed in a portion of the isolation region for connection with the buried collector region. In this manner, the collision between the base region and the collector contact region may be avoided effectively.

1 Claim, 4 Drawing Sheets

BIPOLAR TRANSISTOR

This is a continuation of application Ser. No. 07/231,672, filed Aug. 8, 1988 now abandoned.

BACKGROUND OF THE INVENTION

This invention relates to a bipolar transistor wherein a buried collector region, a base region and an emitter region are formed in a device forming region surrounded by an isolation region and wherein the emitter region is formed by the intermediary of a semiconductor layer isolated by a sidewall insulating layer. More particularly, it relates to a bipolar transistor in which a base contact electrode and a collector contact electrode are arranged in symmetry with each other.

There is proposed in the art the structure of a bipolar transistor operating at an extremely high speed wherein base contact and collector contact are achieved by having a base contact electrode and a collector contact electrode extended to a device forming region from the end of a region delimited or surrounded by an isolation region.

FIG. 6 shows in cross-section such a bipolar transistor in which the base contact electrode is arranged in symmetry with the collector contact electrode. A buried collector region 102 is formed on a semiconductor substrate 101 and a N type epitaxial layer 103 is formed on the collector region 102. An isolation region 104 is formed surrounding the layer 103. This N type epitaxial layer 103 serves as a device forming region. Within the N type epitaxial layer 103, there are formed a N+ type collector contact region 108a and a N type collector contact region 108b for electrical connection with the buried collector region, an intrinsic base region 109, a graft base region 110 and an emitter region 111. In an opening region 105 on the surface of the N type epitaxial layer 103, there are formed a base contact electrode 106 and a collector contact electrode 107 covered by an insulating layer in symmetry with each other. A thin polycrystal silicon layer 112 is formed on the insulating layer covering the contact electrodes 106 and 107.

The collector of the above described prior-art bipolar transistor is connected by way of the buried collector region 102, N+ type collector contact region 108a and the N type collector contact region 108b to the collector contact electrode 107, while the base of the transistor is connected by way of the intrinsic base region 109 and the graft base region 110 to the base contact electrode 106.

In the above described prior-art bipolar transistor, the following problems are encountered in connection with transistor characteristics.

That is, with shrinking in the dimension of the device components, the interval between the intrinsic base region 109 and the N type collector region 108b is reduced. In such case, the P type intrinsic base region 109 and the N type collector contact region 108b collide against each other, thus resulting in the reduced collector to base breakdown voltage and increased parasitic capacitance.

On the other hand, it is desired to increase the impurity concentration of the N type collector contact region 108b to lower the resistance of the region 108b. However, the collector resistance is necessarily unable to the lowered since the impurity regions again may collide against each other in case the impurity concentration is increased.

OBJECT AND SUMMARY OF THE INVENTION

It is therefore a principal object of the present invention to provide a bipolar transistor wherein the collision between the base region and the collector contact region may be effectively avoided while the shrinking the dimension of the drive is aimed at.

It is another object of the present invention to provide a process for preparing such bipolar transistor with a higher efficiency.

According to one aspect of the present invention, a bipolar transistor has a buried collector region, a base region and an emitter region in a device forming region delimited or a surrounded by an isolation region. The emitter region is isolated by a sidewall insulating layer on the major substrate surface. The base region is connected to the base contact electrode by way of a graft base region. The buried collector region is connected to a collector electrode arranged in symmetry with the base contact electrode with respect to the emitter region. The collector contact electrode is connected to the buried collector region by way of an opening formed at at least a portion of the isolation region. In a manner distinct from the opening formed previously by selective oxidation, the opening is formed through an isolation region after formation of the isolation region. By making a connection by way of this opening, a larger distance is provided between the base region and the collector contact region to avoid the collision between the impurity regions.

According to another aspect of the present invention, there is provided a process comprising the steps of forming a buried collector region, a base region and an emitter region in a device forming region surrounded by an isolation region, forming an impurity region contiguous to said buried collector region through an opening formed by etching at least a portion of said isolation region, and forming a collector contact electrode in said opening in symmetry with said base contact electrode with respect to said emitter region.

DESCRIPTION OF THE PREFERRED EMBODIMENT

Figure 1:
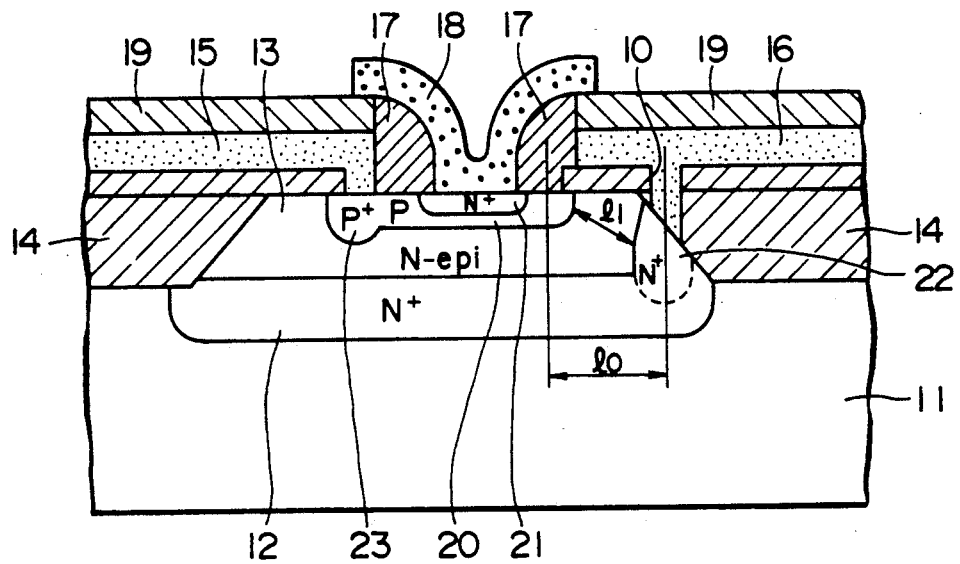
FIG. 1 is a cross-sectional view showing an embodiment of the bipolar transistor according to the present invention.

The bipolar transistor of the present embodiment has a structure as shown in FIG. 1. A N type buried collector region 12 is formed on a semiconductor substrate 11. On this N type buried collector region 12 is formed a N type epitaxial layer 13. Adjacent to the N type epitaxial layer 13, an isolation region 14 is formed by a selective oxidation process. The N type epitaxial layer 13 is a device forming region surrounded by the isolation region 14. On the surface of this N type epitaxial layer 13, a base contact electrode 15 covered by an insulating layer 19 is formed over the isolation region 14 so as to partially contact with the surface of the layer 13. Similarly, a collector contact electrode 16 is provided in symmetry with the base contact electrode 15 with respect to an emitter region and extended to over the isolation region 14 as it is covered by an insulating layer 19. The base contact electrode 15 has a terminal portion thereof contacted with the aforementioned N type epitaxial layer 13. In the contact region between the terminal portion of the base contact region 15 and the N type epitaxial layer 13, a P+ type graft base region 23 is formed by diffusion of impurities from the base contact electrode 15. This graft base region 23 is contiguous to a P type intrinsic base region 20 formed on the major surface of the N type epitaxial layer 13. Within the intrinsic base region 20 is formed an emitter region 21 so as to face to the major surface of the layer 13. This emitter region 21 is connected to an emitter electrode, not shown, through a thin polycrystal silicon layer 18 applied to a space between side walls 17, 17 formed on the end surfaces of the base contact electrode 15, collector contact electrode 16 and the insulating layer 19.

The collector contact electrode 16 is not connected with the N type epitaxial layer in the vicinity of the sidewalls 17, but is connected with the buried collector region 12 through an opening 10 formed in the isolation region 14 towards the side thereof where the collector contact electrode 16 is formed. It is noted that, the buried collector region 12 and the collector contact region 16 are electrically connected with each other through a N+ type collector region 22 which is a high concentration impurity region formed in the N type epitaxial layer 13 between the buried collector region 12 and the opening 10, such that, as described later, the characteristic of the bipolar transistor may be improved.

Figure 6:
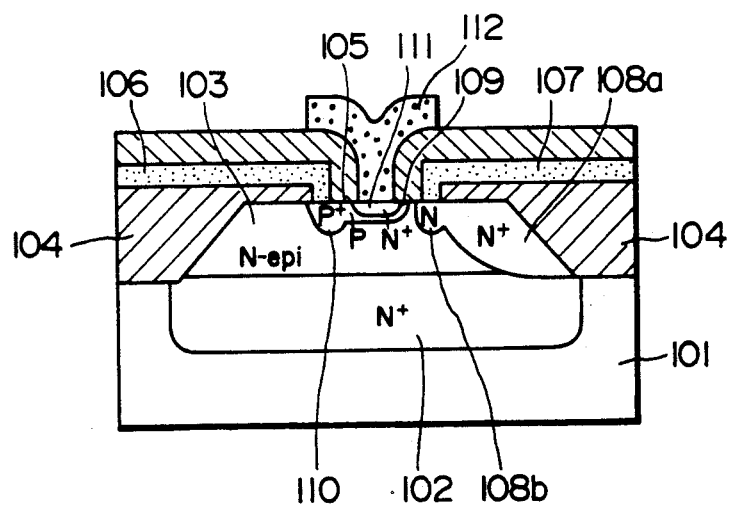
FIG. 6 is a cross-sectional view showing a typical prior-art bipolar transistor.

The opening 10 is formed on a boundary surface which is inclined relative to the major surface and which is disposed between the isolation region 14 and the N epitaxial layer 13. Although it is known to make an electrical contact or connection at a region previously isolated by the insulating region, the opening 10 is formed in the present embodiment through the isolation region 14. By providing the opening 10 in this manner, the opening 10 is shifted towards the isolation region by a distance equal to $l_0$, for example, as compared to the case shown in FIG. 6 wherein the collector contact or connection is made in the vicinity of the sidewall 17 similarly to the base contact or connection. Hence, the distance $l_1$ between the intrinsic base region 20 and the collector contact region 22 may be selected to be larger by an amount corresponding to the thus procured distance $l_0$. This results in prevention of the collision between the intrinsic base region 20 and the collector contact region 22 for reducing the parasitic capacitance and elevating the collector to base breakdown voltage. Also, since the intrinsic base region 20 and the collector contact region 22 are formed with the sufficiently large distance $l_1$, the impurity concentration of the collector contact region 22 may be increased in order to lower the collector resistance. This is favorable above all when the shrinking of the dimension of the device is aimed at.

It is unnecessary that the base contact electrode and the collector contact be arranged in symmetry with each other completely. Thus these electrode may be arranged so as to be partially confronted to each other.

The position of the opening 10 may be such that a sufficient distance may be procured between it and the intrinsic base region 20, while the opening 10 may be extended through to the bottom surface of the isolation region 14. A PNP type transistor may naturally be employed as the bipolar transistor.

The process for preparing the bipolar transistor is hereafter explained. It is possible with the present process to avoid effectively the collision between the base region and the collector region to permit a bipolar transistor to be produced easily with improved device characteristics. The process will be explained hereinbelow step by step by referring to FIGS. 2a to 2e.

Figure 2A:
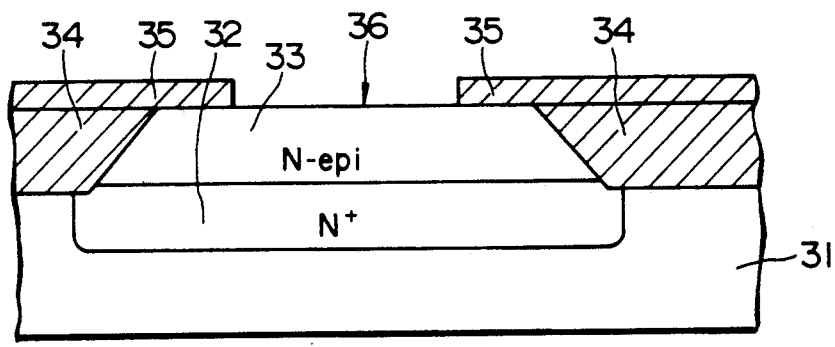
FIGS. 2a to 2e are cross-sectional views showing the process for preparing the bipolar transistor according to the present invention step by step.

First, as shown in FIG. 2a, a N+ type buried collector region 32 is formed on a semiconductor substrate 31, and a N type epitaxial layer 33 is stacked on the layer 32. On this N type epitaxial layer 33, an isolation region 34 is formed selectively by, for example, selective oxidation. After formation of the isolation region 34, the region 34 is planarized and the overall surface of the region 34 is covered with a CVDSiO$_2$ film 35. The surface of the N type epitaxial layer 33, which represents a device forming region, is covered with this CVDSiO$_2$ layer 35.

Then, a portion of the CVD SiO$_2$ film 35 disposed on the N type epitaxial layer 33 is removed for exposing a portion of the epitaxial layer at 36.

Figure 2B:
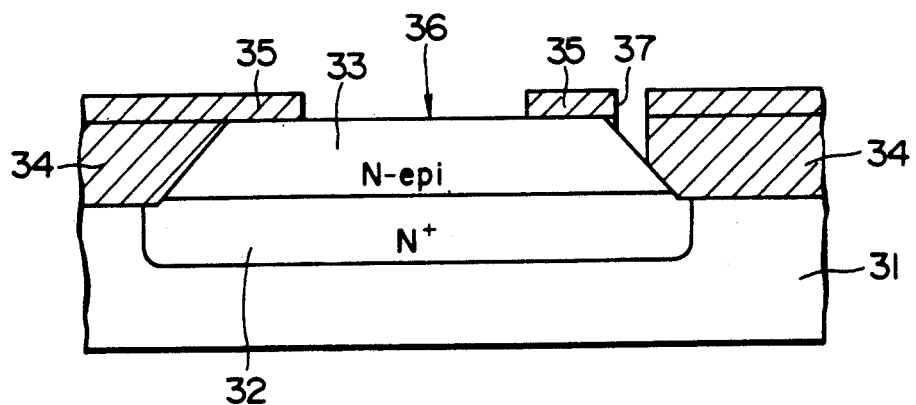

Then, as shown in FIG. 2b, an opening 37 is formed by etching a portion of the isolation region 34. This opening 37 may be formed simultaneously with the exposed surface 36 or formed by a separate etching process. The position of the opening 37 may for example be on the boundary surface between the insulation region 34 and the N type epitaxial layer 33, which is inclined relative to the major surface. The area of the buried collector region 32 can be reduced by making the collector contact at this position. However, this is only illustrative and the collector contact may be made at any other position which will assure a positive separation between the collector contact region and the intrinsic base region to be formed later. Or alternatively, the opening 37 may be formed so that the buried collector region 32 will exist directly at the bottom of the opening.

Still alternatively, the impurity region contiguous to the buried collector region 32 may be formed on the bottom of the opening 37 as by ion implantation after the formation of the opening 37, with the exposed surface 36 being masked.

Figure 2C:
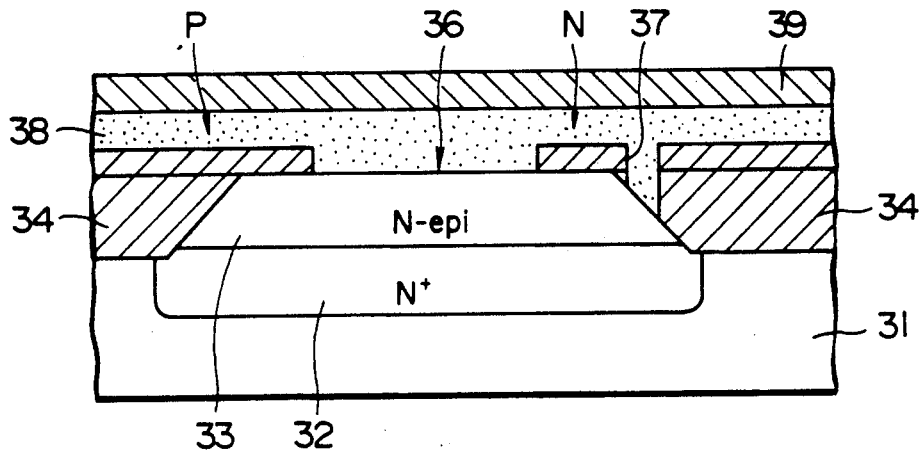

After formation of the opening 37, a polycrystal silicon layer 38 is formed on the overall surface, as shown in FIG. 2c. The opening 37 is filled with the polycrystal silicon layer 38, the polycrystal silicon layer 38 being then contiguous to the N type epitaxial layer 33 at the exposed surface 36. The polycrystal silicon layer 38 thus formed may be planarized if necessary or if so desired.

Then, using a resist mask, the N type and P type impurities are selectively introduced by ion implantation into the thus formed polycrystal silicon layer 38. Thus the N type impurity for making collector contact is introduced into the polycrystal silicon layer 38 on the side thereof including the exposed portion 36 and the opening 37 whereas the P type impurity for making base contact is introduced into the polycrystal silicon layer 38 on the side thereof including the exposed portion 36 and not including the opening 37. After the impurities are selectively introduced in this manner, a CVDSiO$_2$ film 39 is deposited on the overall surface of the polycrystal silicon layer 38.

Figure 2D:
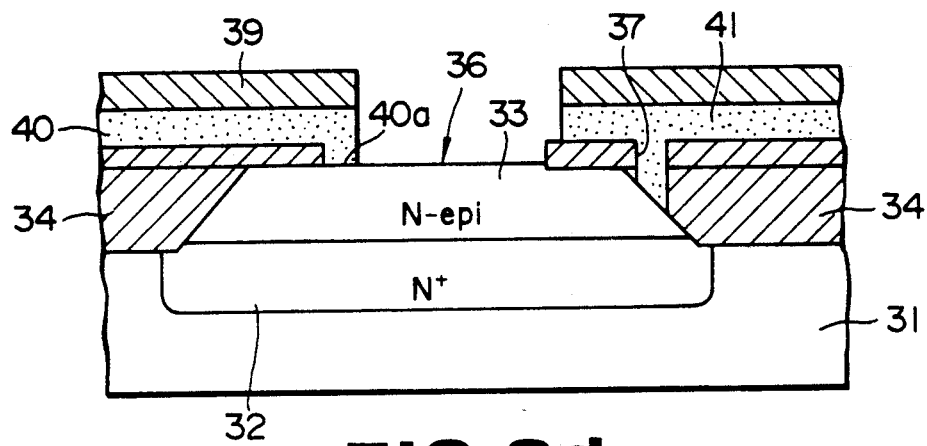

Then, using a mask as required, an opening for an emitter is formed, as shown in FIG. 2d. Thus a collector contact electrode 41 composed of the polysilicon layer 38 into which the N type impurity is introduced is formed in symmetry with a base contact electrode 40 composed of a polycrystal silicon layer 38 into which the P type impurity is introduced, with respect to an emitter region which will be formed in the next process step. Since the collector contact electrode 41 also fills the opening 37, collector contact may be made at the opening 37, so that the collector contact electrode need not be extended into contact with the N type epitaxial layer 33 at the exposed surface 36 of the N type epitaxial layer 33. The base contact electrode 40 is contacted at a terminal portion 40a thereof with the N type epitaxial layer 33, and the base contact region is formed by impurity diffusion from this terminal portion 40a.

Then, on that portion of the surface where the emitter opening is formed as described above, a CVDSiO$_2$ film is formed and then etched back to form sidewalls 42, 42. A thin polycrystal silicon layer 47 is then formed between the sidewalls 42, 42 and a P type impurity is introduced into the layer 47.

Figure 2E:
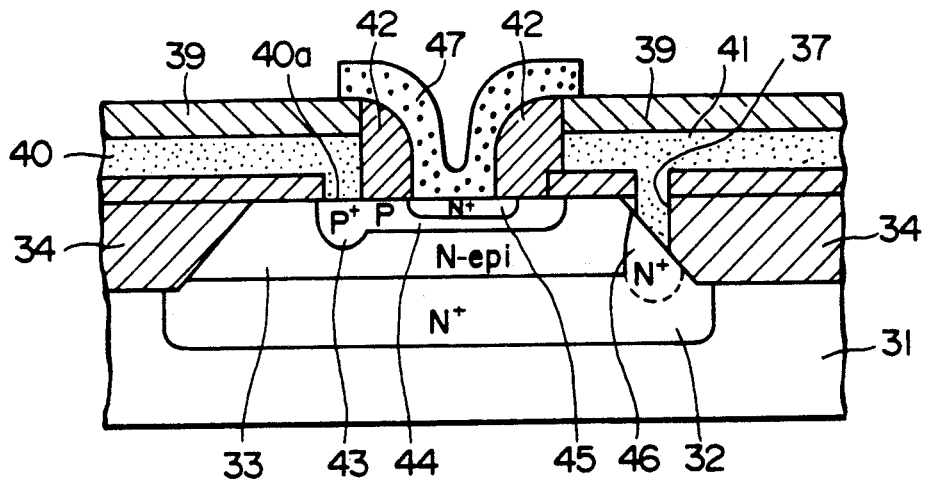

Then, an annealing is carried out so that, as shown in FIG. 2e, a P type base contact region 43 is formed by diffusion from the terminal portion 40a of the base contact electrode 40, while an intrinsic base region 44 is formed by diffusion from the thin polycrystal silicon layer 47 into which the impurity has been introduced. Also, by the same or separate step, a N+ type collector contact region 46 interconnecting the buried collector region 32 and the collector contact electrode 41 is formed by impurity diffusion from the collector contact electrode 41 within the opening 37.

The N type impurity is then introduced to a high concentration into the thin polycrystal silicon layer 47 and annealing is then carried out so that an emitter region 45 is formed in self-alignment with the intrinsic base region 44.

It is noted that the sidewall 42 may be of a dual structure, which is highly effective above all when a projection such as an oxide film exists in the vicinity of the sidewall of the collector contact electrode 41. Any type of annealing may be employed, such as rapid thermal annealing (RTA).

In accordance with the above described process for preparing the bipolar transistor, a larger distance may be provided between the intrinsic base region 44 and the collector contact region 46 for reducing the parasitic capacitance and improving the collector to base breakdown voltage. In addition, the device area may be reduced for promoting the integration and shrinking of the dimension of the bipolar transistors.

Figure 3:
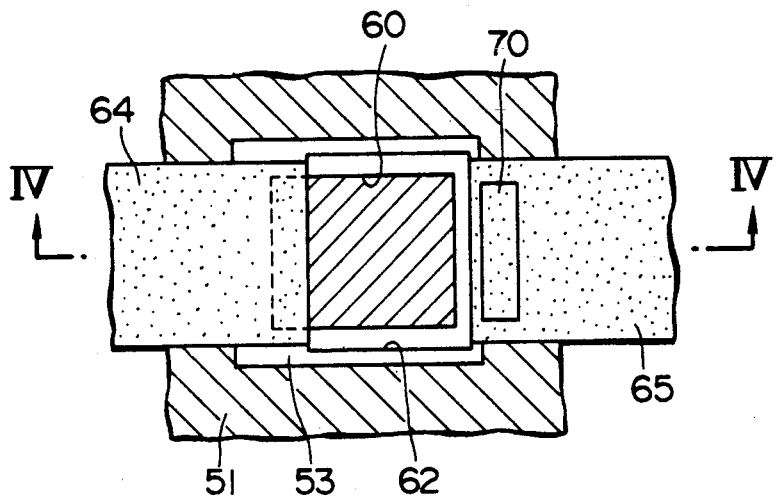
FIG. 3 is a plan view showing a second embodiment of the present invention.
Figure 4:
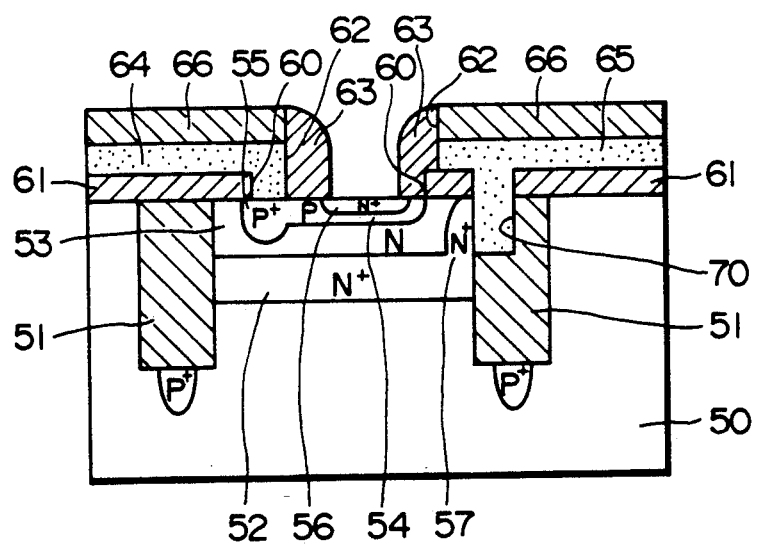
FIG. 4 is a cross-sectional view taken along line IV—IV of FIG. 3.

FIGS. 3 and 4 illustrate the construction of a bipolar transistor having a trench-shaped isolation region. The construction is such that a N+ type buried collector region 52 is formed on a semiconductor substrate 50 and a N type semiconductor crystal region 53 is formed on this N+ type buried collector region 52. This N type semiconductor crystal region 53 represents a device forming region which is surrounded by a trench-shaped isolation region 51.

A base contact electrode 64 is formed on the surface of the N type semiconductor crystal region 53 so as to partially contact with the aforementioned surface and to overlie an insulating layer 61, and is covered by an insulating layer 66. A collector contact electrode 65 is formed on the insulating layer 61 in symmetry with the base contact electrode 64, and is covered by the insulating layer 66. The collector contact electrode 65 is not in surfacial contact with the semiconductor crystal region and has an end surface 62 covered by a sidewall 63. A portion of the collector contact electrode 65 fills an opening 70 formed on a portion of the trench-shaped isolation region 51. The collector contact electrode 65 is connected with a N+ type collector contact region 57 formed in the semiconductor crystal region 53 in continuation with the N+ type buried collector region 52. On a portion of the semiconductor crystal region 53 contacted by the base contact region 64, a base contact region 55 is formed by diffusion with the electrode 64 as the surface of diffusion. An intrinsic base region 54 is formed by diffusion with the sidewall 63 as the mask and connected to the base contact region 55. An emitter region 56 is similarly formed at the inner side of the intrinsic base region 54 by using the same mask.

In the above described structure of the bipolar transistor, a larger distance may be procured between the intrinsic base region 54 and the collector contact region 57, so that the collision between the intrinsic base region 54 and the collector contact region 57 may be avoided for reducing the parasitic capacitance and improving the collector to base breakdown voltage. In addition, owing to the larger distance between the intrinsic base region 54 and the collector contact region 57, the higher impurity concentration of the collector contact region 57 may be realized with the lower collector resistance. A further advantage may be derived when shrinking of the dimension of the device components is aimed at.

Figure 5:
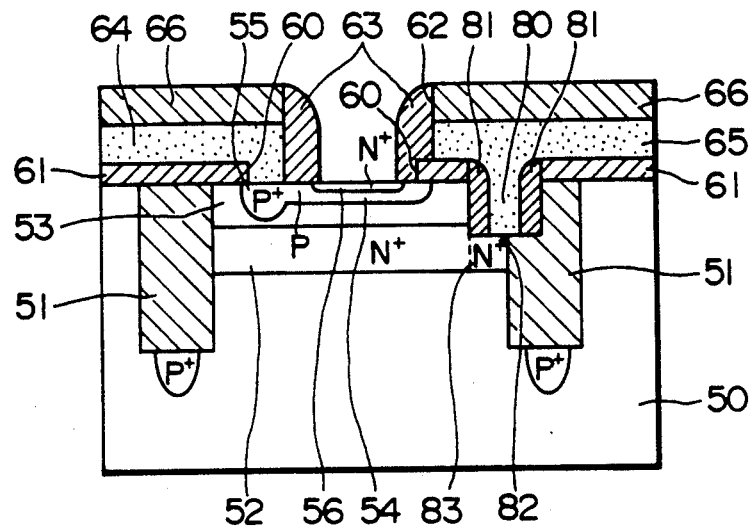
FIG. 5 is a cross-sectional view showing a third embodiment of present invention.

FIG. 5 illustrates a modification of the bipolar transistor shown in FIGS. 3 and 4. It will be noted that the same reference numerals are used in FIG. 5 to depict the same parts or components as those shown in FIG. 4 and the corresponding description is omitted for simplicity.

The bipolar transistor shown in FIG. 5 differs from that shown in FIG. 4 as to the structure of an opening 80.

Thus a sidewall 81 formed of an insulating material is formed on the lateral wall of the opening 80, the inside of which is filled a collector contact electrode 65. On a bottom 82 of the opening 80, a portion of a N+ type buried collector region 52 is connected to the portion of the collector contact electrode 65 which is defined by the side wall 81.

In the present modified embodiment of the bipolar transistor, insolation between the collector contact region 65 and the intrinsic base region 14 can be additionally insured by the sidewall 81 of the opening 80.

It is noted that the base contact electrode and the collector contact electrode need not be arranged completely symmetrically to each other, and that the bipolar transistor may also be a PNP type transistor.

What is claimed is:

1. A bipolar transistor comprising,
   a substrate,
   a monocrystalline semiconductor body on said substrate, said body having a surface incorporating a thick isolation region,
   an epitaxially formed device forming region surrounded by said isolation region, and having a surface,
   a buried collector region formed in a portion of said device forming region with said substrate, a base region facing a portion of the surface of said device forming region, an emitter region facing to a portion of the surface of said device forming region and surrounded by said base region, a base contact electrode extending from said isolation region to above said device forming region and connecting to said base region on the surface of said device forming region, said base contact electrode being disposed on the surface of said isolation region and extending laterally away from said device forming region in one direction, a collector contact electrode formed on said isolation region and arranged in symmetry with said base contact electrode with respect to said emitter region, said collector contact electrode being disposed on the surface of said isolation region and extending laterally away from said device forming region in a direction opposite to said one direction, an opening formed through at least a portion of said thick isolation region in its thickness direction and interconnecting said buried collector region and the collector contact electrode, wherein said isolation region is formed by selective oxidation and wherein said opening is formed through said isolation region, and wherein said opening is formed to only an inclined boundary surface between said isolation region and said device forming region, said boundary surface being inclined relative to the vertical and inclined relative to the horizontal.

* * * * *